United States Patent
Hung et al.

(10) Patent No.: US 9,414,505 B2
(45) Date of Patent: Aug. 9, 2016

(54) MOUNTING APPARATUS, COMPONENT ASSEMBLY, AND ELECTRONIC DEVICE

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Wen-Hsiang Hung, New Taipei (TW); Chun-Bao Gu, Wuhan (CN); Hong-Mei Zhang, Wuhan (CN)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 10 days.

(21) Appl. No.: 14/613,017

(22) Filed: Feb. 3, 2015

(65) Prior Publication Data

US 2016/0205795 A1    Jul. 14, 2016

(30) Foreign Application Priority Data

Jan. 9, 2015    (CN) .......................... 2015 1 0010663

(51) Int. Cl.
| H05K 7/02 | (2006.01) |
| H05K 7/04 | (2006.01) |
| H05K 5/00 | (2006.01) |
| H05K 1/18 | (2006.01) |
| H05K 1/14 | (2006.01) |

(52) U.S. Cl.
CPC .............. *H05K 5/0026* (2013.01); *H05K 1/141* (2013.01); *H05K 1/18* (2013.01)

(58) Field of Classification Search
USPC ......... 361/727–730, 801, 802, 807, 809, 810; 439/31, 131, 165, 326, 446, 630; 455/575.1–575.3, 575.24
See application file for complete search history.

(56) References Cited

U.S. PATENT DOCUMENTS

| 7,004,764 | B2 * | 2/2006 | Boudreau | H05K 7/142 174/138 G |
| 7,294,009 | B1 * | 11/2007 | Peng | H05K 7/1431 439/326 |
| 7,344,401 | B2 * | 3/2008 | Zuo | H01R 13/2442 439/326 |
| 7,666,017 | B2 * | 2/2010 | Chen | G06K 7/0021 439/131 |
| 8,184,451 | B2 * | 5/2012 | Chan | G06F 1/186 361/801 |
| 8,605,456 | B2 * | 12/2013 | Brad | G06F 1/185 361/784 |
| 8,649,182 | B2 * | 2/2014 | Ko | G06F 1/1633 361/755 |
| 9,042,118 | B2 * | 5/2015 | Takeguchi | H04N 5/64 361/809 |
| 9,052,868 | B2 * | 6/2015 | Kristiansen | H05K 3/301 |
| 2012/0182188 | A1 * | 7/2012 | Gu | G06F 1/181 343/702 |

* cited by examiner

*Primary Examiner* — Hung S Bui
(74) *Attorney, Agent, or Firm* — ScienBiziP, P.C.

(57) ABSTRACT

An electronic device includes an enclosure, a circuit board mounted in the enclosure, an electronic component attached to the circuit board, an antenna module mounted to the electronic component, and a mounting apparatus configured to mount the antenna module. The mounting apparatus includes a pressing member mounted on the circuit board. The mounting apparatus includes a pressing panel, a pressing block extending from the pressing panel, a positioning piece extending from the pressing panel, and a pressing piece extending from the pressing block. The pressing piece has a back wall. The pressing block presses the electronic component, the pressing panel presses the antenna module, and the back wall and the positioning piece abut against two adjacent sidewalls of the electronic component.

20 Claims, 8 Drawing Sheets

MOUNTING APPARATUS, COMPONENT ASSEMBLY, AND ELECTRONIC DEVICE

CROSS-REFERENCE TO RELATED APPLICATIONS

This application claims priority to Chinese Patent Application No. 201510010663.6 filed on Jan. 9, 2015, the contents of which are hereby incorporated by reference.

FIELD

The subject matter herein generally relates to a mounting apparatus, and more particularly to a mounting apparatus which can firmly mount an antenna module to an electronic component.

BACKGROUND

An antenna module is applied in an electronic device to send and receive signals. The antenna module is generally mounted to an electronic component of the electronic device.

BRIEF DESCRIPTION OF THE DRAWINGS

Implementations of the present technology will now be described, by way of example only, with reference to the attached figures.

DETAILED DESCRIPTION

Figure 1:
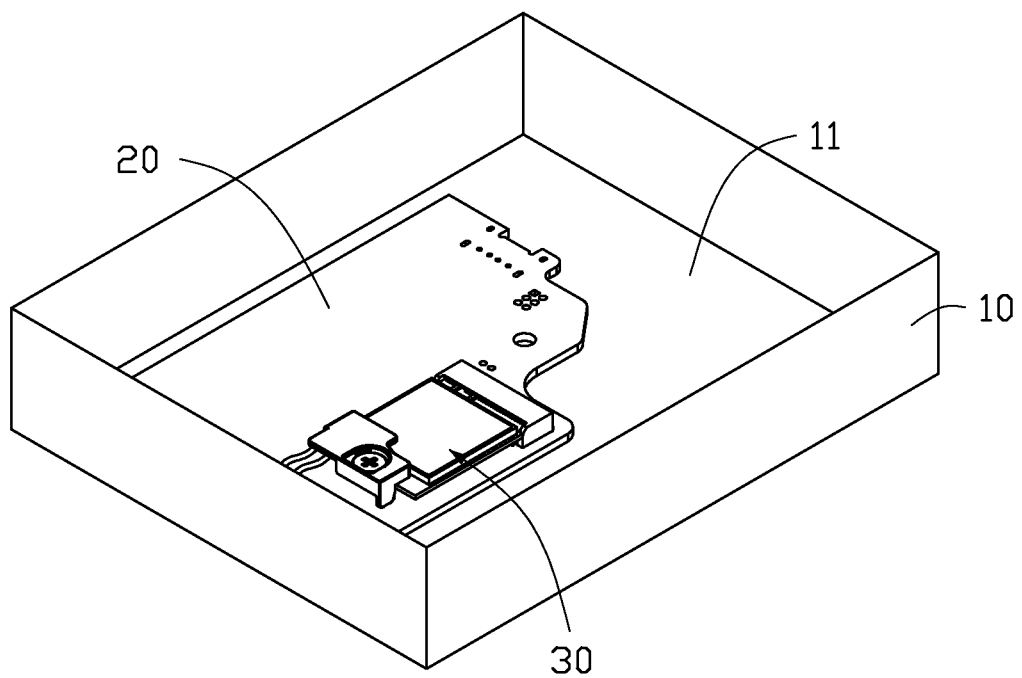
FIG. 1 is an assembled, isometric view of an electronic device in accordance with an embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in details so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

FIG. 1 illustrates an embodiment of an electronic device including an enclosure 10, a circuit board 20, and a component assembly 30 attached to the circuit board 20. The enclosure 10 has a bottom plate 11, and the circuit board 20 is mounted on the bottom plate 11.

Figure 2:
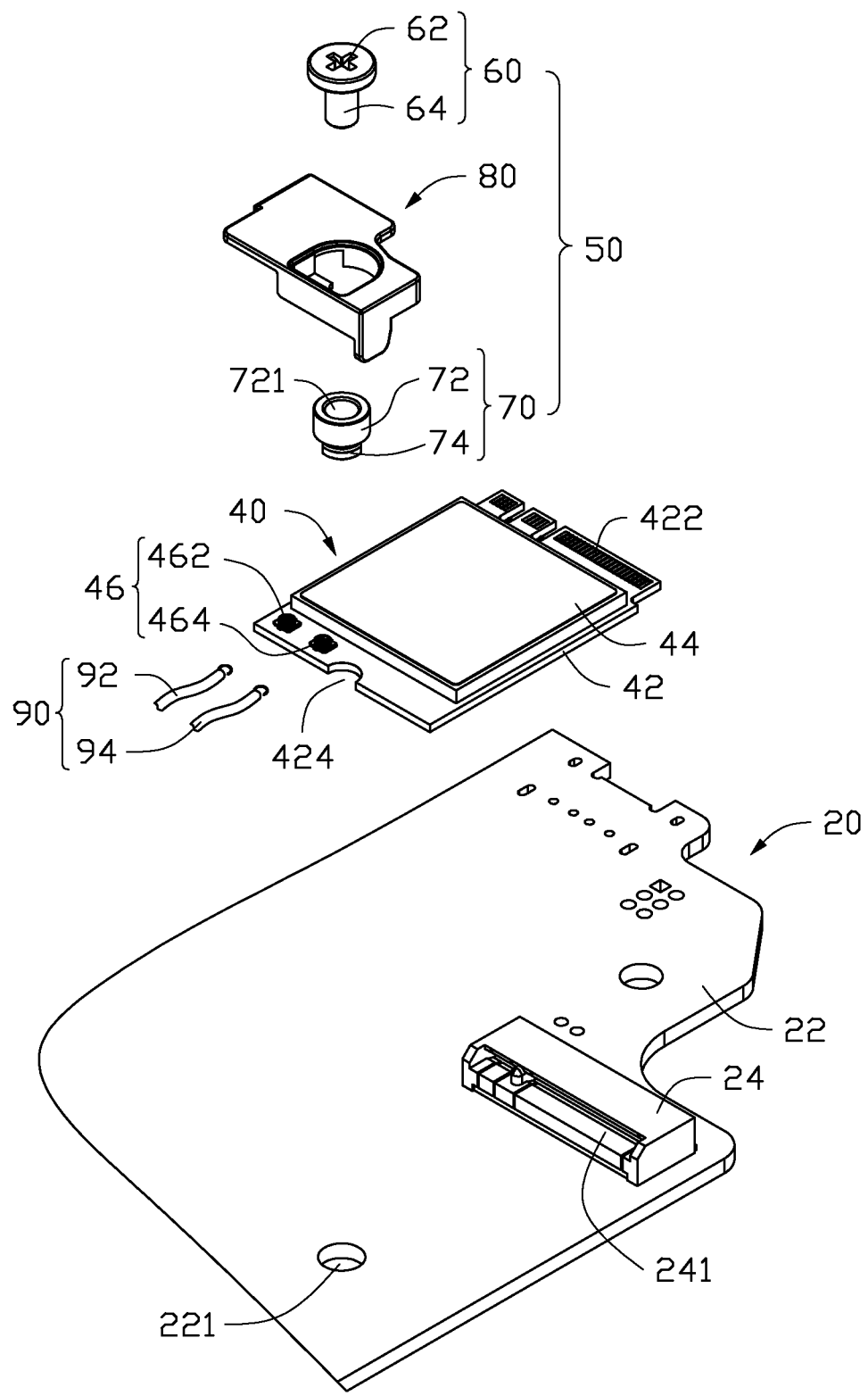
FIG. 2 is an exploded, isometric view of a component assembly and a circuit board of the electronic device of FIG. 1.

FIG. 2 illustrates the circuit board 20 including a main body 22 and a connector 24 mounted on the main body 22. A mounting hole 221 is defined in the main body 22. A slot 241 is defined in the connector 24.

The component assembly 30 can include an electronic component 40, a mounting apparatus 50, and an antenna module 90. The mounting apparatus 50 can include a fastener 60, a supporting member 70, and a pressing member 80. The antenna module 90 can include a first antenna 92 and a second antenna 94. In at least one embodiment, the electronic component 40 is a wireless card.

The electronic component 40 can include a card body 42 and a chip 44 mounted on the card body 42. The chip 44 is substantially located at the center of the card body 42. In at least one embodiment, a step structure is formed by the card body 42 and the chip 44.

A connecting portion 422 is attached to an end of the card body 42, and a fastening hole 424 is defined at another end of the card body 42. The fastening hole 424 is semicircular and extends to an edge of the card body 42. In at least one embodiment, the fastening hole 424 and the connecting portion 422 are located at two opposite sides of the chip 44. An antenna connector 46 is attached to the card body 42 and located at a same side of the chip 44 with the fastening hole 424. The antenna connector 46 can include a first connector 462 and a second connector 464 spaced apart.

The fastener 60 can include a head 62 and a securing post 64 extending from the head 62. In at least one embodiment, the head 62 is substantially a cylinder, and a diameter of the head 62 is larger than that of the securing post 64. The fastener 60 is a bolt or a screw.

The supporting member 70 can include a supporting portion 72 configured to support the electronic component 40 and a securing portion 74 configured to be mounted to the circuit board 20. In at least one embodiment, the supporting portion 72 and the securing portion 74 are cylinders, and a diameter of the supporting portion 72 is larger than that of the securing portion 74. A latching hole 721 is defined in the supporting portion 72 and extends to the securing portion 74.

Figure 3:
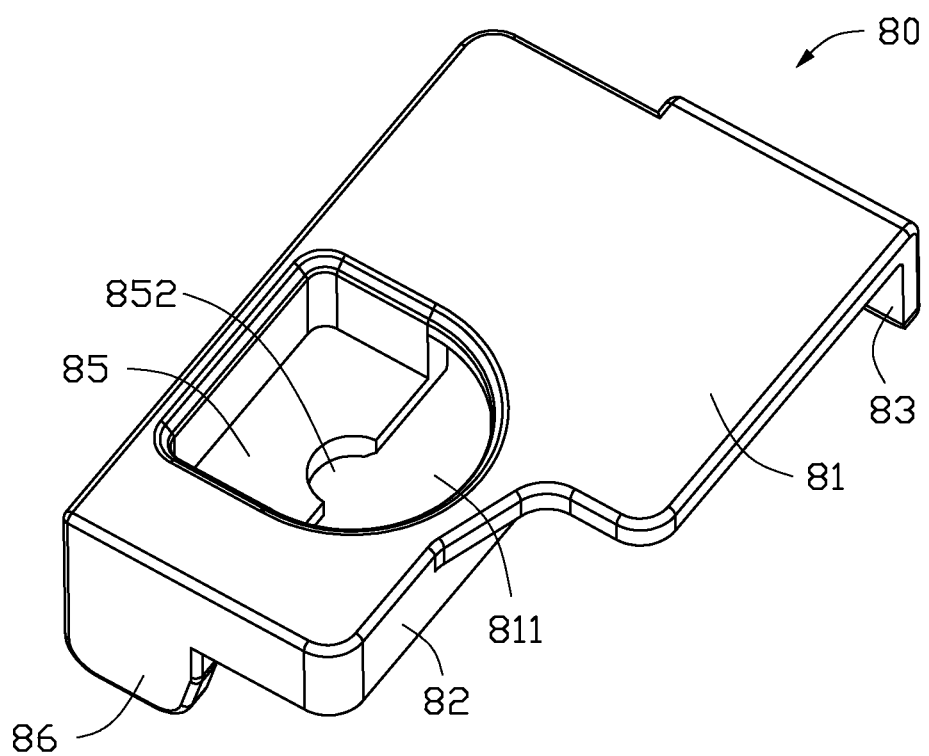
FIG. 3 is an isometric view of a pressing member of FIG. 2.
Figure 4:
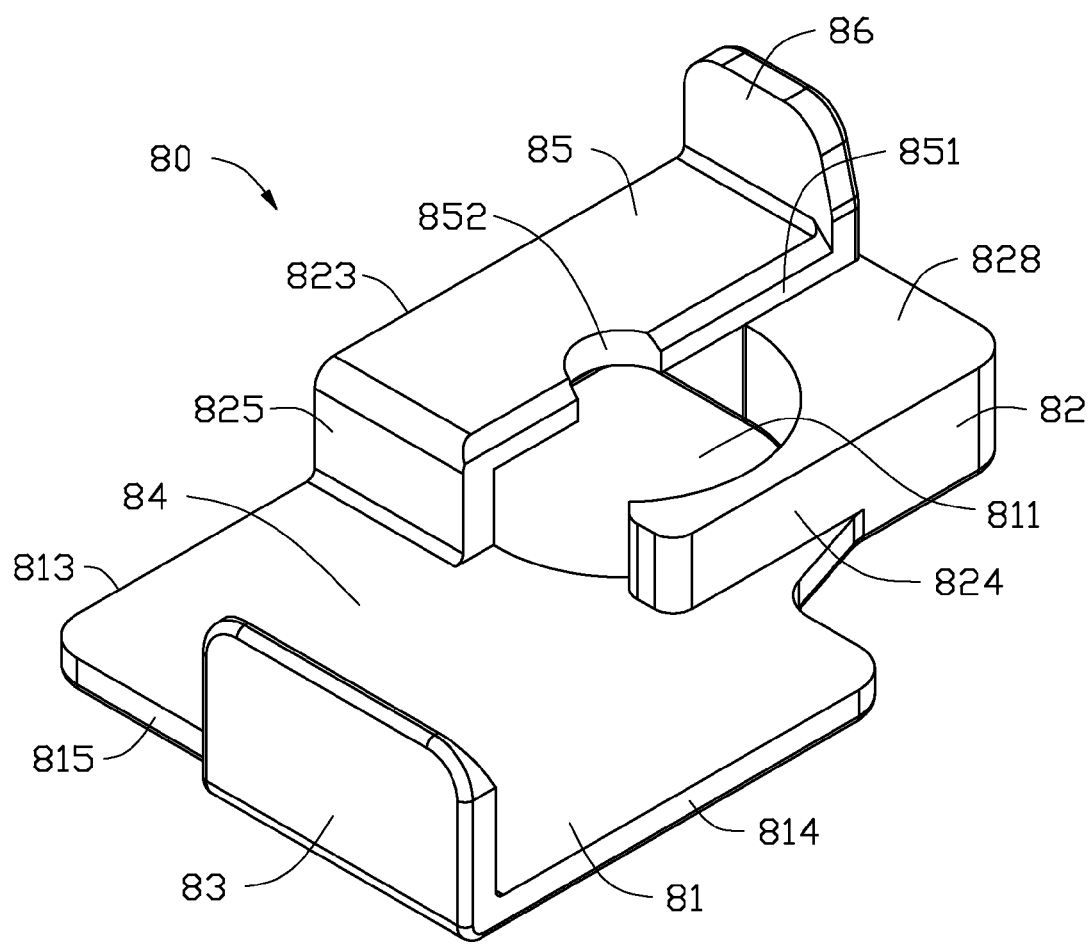
FIG. 4 is similar to FIG. 3, but viewed from a different angle.
Figure 5:
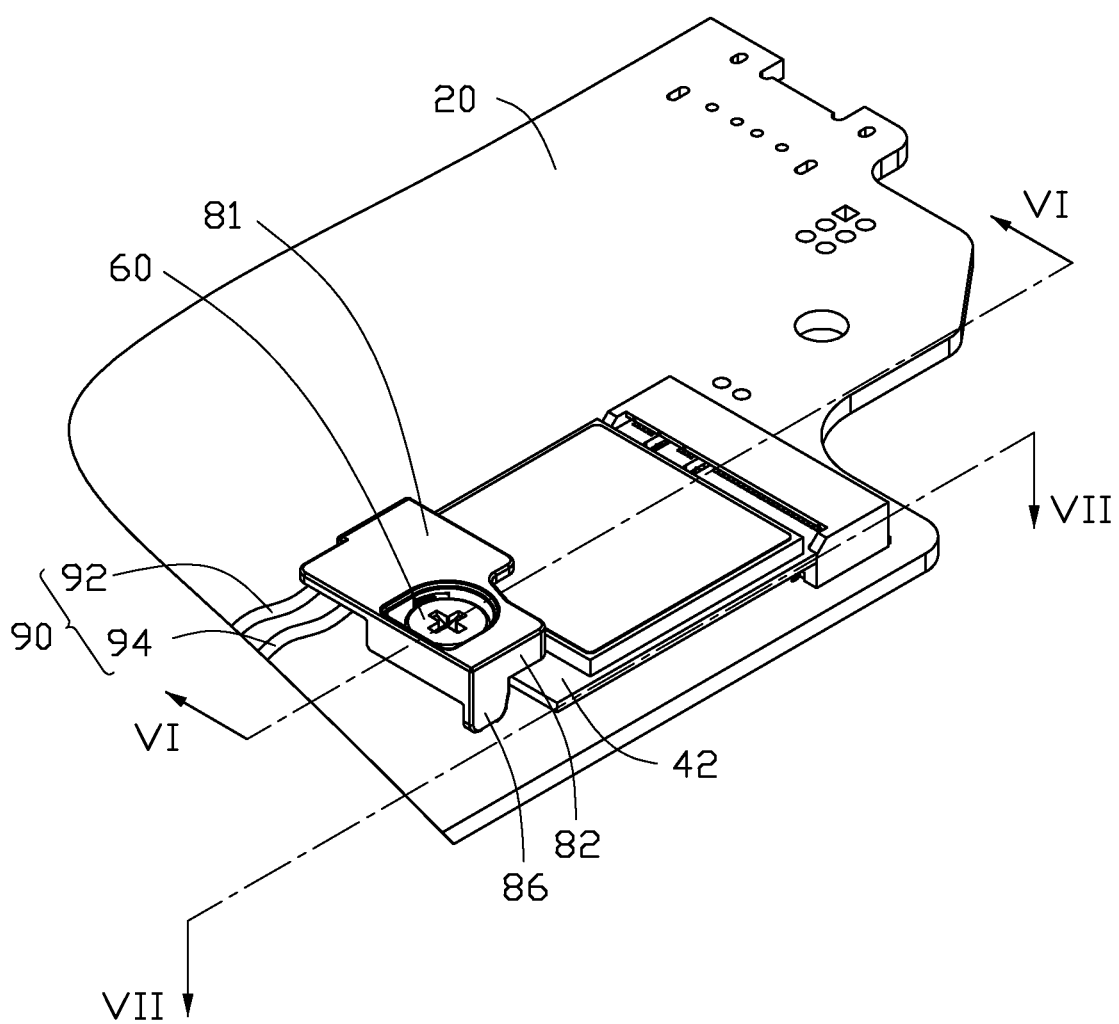
FIG. 5 is an assembled, isometric view of the component assembly and the circuit of FIG. 2.
Figure 6:
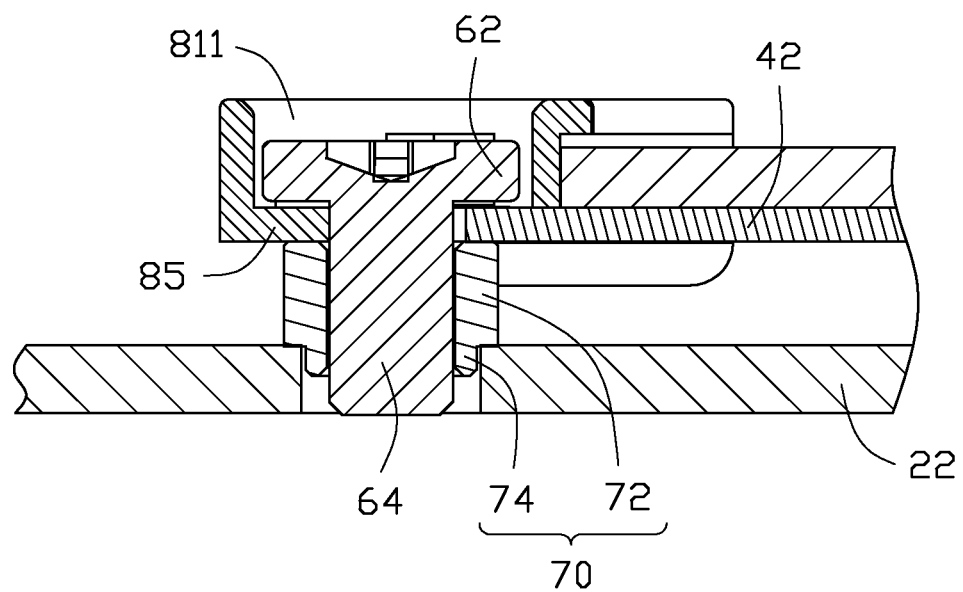
FIG. 6 is a cross-sectional view of FIG. 5, taken along a line VI-VI.
Figure 7:
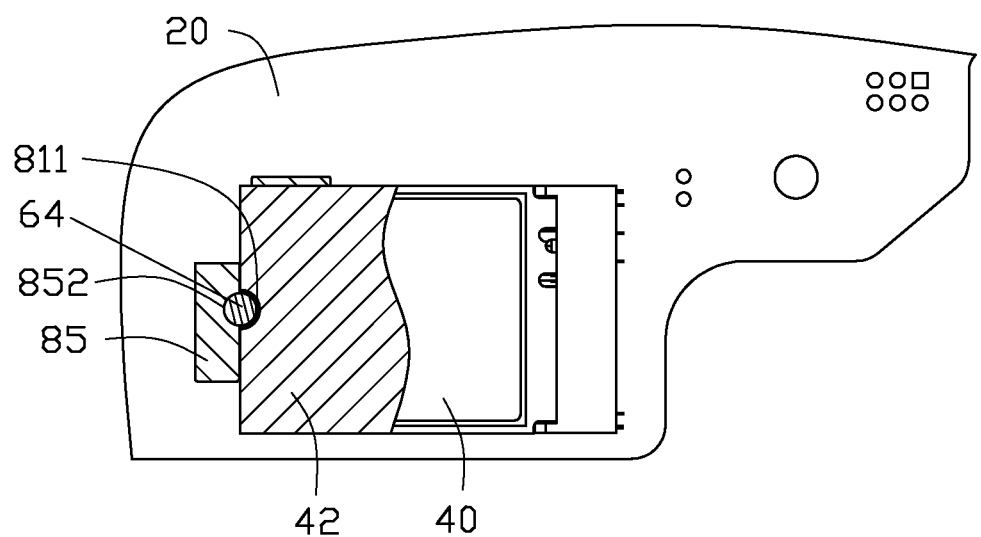
FIG. 7 is a cross-section, cutaway view of FIG. 5, taken along a line VII-VII.
Figure 8:
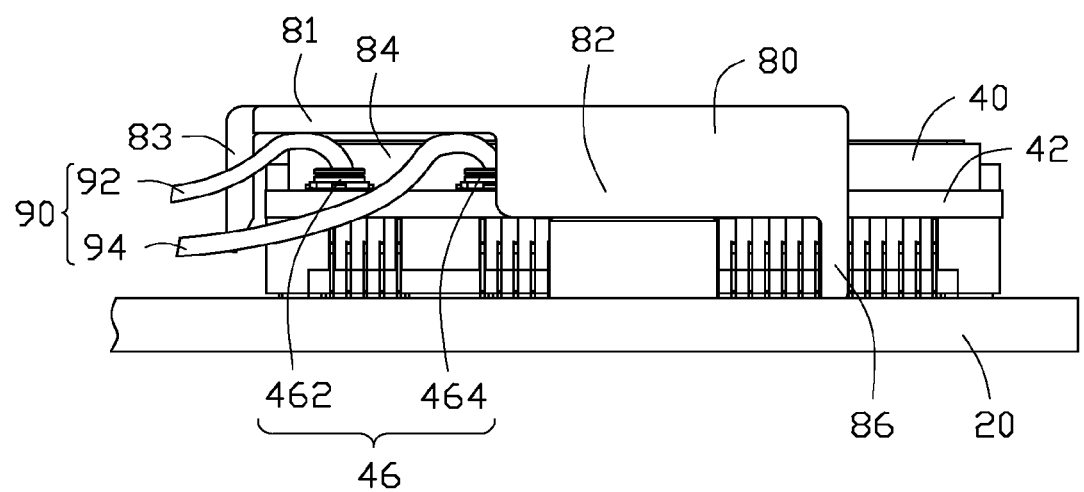
FIG. 8 is a side, cutaway view of the component assembly of FIG. 5.

FIGS. 3-4 illustrate the pressing member 80 including a planar pressing panel 81 and a pressing block 82 perpendicularly extending from the pressing panel 81. In at least one embodiment, the pressing panel 81 is substantially "L" shaped, and the pressing block 82 is cuboid. An operation hole 811 is defined in the pressing panel 81. The operation hole 811 is a through hole and extends to the pressing block 82. An extending direction of the operation hole 811 is substantially perpendicular to the pressing panel 81. A positioning piece 83 extends from a side of the pressing panel 81 away from the pressing block 82. The positioning piece 83 is substantially perpendicular to the pressing panel 81. A channel 84 is defined in the pressing member 80 and located between the positioning piece 83 and the pressing block 82.

The pressing panel 81 can include a front wall 813, a rear wall 814, and a side wall 815. The rear wall 814 is parallel with the front wall 813. The front wall 813 is connected with the rear wall 814 by the side wall 815. The positioning piece 83 extends from the side wall 815 of the pressing panel 81. The side wall 815 is substantially perpendicular to the front wall 813 and the rear wall 814.

The pressing block 82 can include a front surface 823, a rear surface 824, and a side surface 825. The rear surface 824 is parallel with the front surface 823. The front surface 823 is connected with the rear surface 824 by the side surface 825. The front surface 823, the rear surface 824, and the side surface 825 are substantially perpendicular to the pressing panel 81. The front surface 823 and the front wall 813 are located at a first plane perpendicular to the pressing panel 81. A distance between the front surface 823 and the rear surface 824 is shorter than a distance between the front wall 813 and the rear wall 814. The side surface 825 is substantially parallel with the positioning piece 83. The channel 84 is located between the side surface 825 and the positioning piece 83.

The pressing block 82 further includes a bottom surface 828 parallel with the pressing panel 81, and the bottom surface 828 is substantially perpendicular to the front surface 823, rear surface 824, and the side surface 825.

The pressing member 80 further includes a pressing piece 85 extending from the bottom surface 828. The pressing piece 85 covers a part of the operation hole 811. In at least one embodiment, the pressing piece 85 is cuboid, and a thickness of the pressing piece 85 is substantially equal to that of the card body 42. The pressing piece 85 can cover half of the bottom surface 828, and form a step structure with the pressing block 85. The pressing piece 85 has a back wall 851 perpendicularly connected to the bottom surface 828. A securing hole 852 is defined in the pressing piece 85. The securing hole 852 extends to the back wall 851 and is communicated with the operation hole 811. An extending direction of the securing hole 852 is as same as that of the operation hole 811. In at least one embodiment, the securing hole 852 is a semicircular, and a diameter of the securing hole 852 is equal to that of the fastening hole 424. A hole configured to receive the securing post 64 is defined by the securing hole 852 and the fastening hole 424.

The pressing member 80 further includes a supporting piece 83 extending from one side of the pressing piece 85 away from the side surface 825. The supporting piece 86 is substantially parallel with the positioning piece 83, and perpendicular to the pressing panel 81 and the pressing piece 85. In at least one embodiment, a distance between a free end of the supporting piece 86 and the pressing panel 81 is larger than a free end of the positioning piece 83 and the pressing panel 81.

FIGS. 5-8 illustrate an assembly of the electronic device. The circuit board 20 is mounted on the bottom plate 11 of the enclosure 10. The securing portion 74 is engaged in the mounting hole 221 in order to mount the supporting member 70 in the circuit board 20.

The first antenna 92 is connected to the first connector 462, and the second antenna 94 is connected to the second connector 464. The pressing member 80 is moved towards the circuit board 20 till the pressing member 80 is supported on the supporting member 70. The pressing block 82 presses the electronic component 40, the bottom surface 828 abuts against the card body 42, the supporting piece 86 is supported on the circuit board 20, and the positioning piece 83 abuts against a sidewall of the card body 42. The pressing panel 81 and the supporting member 70 are located at two opposite sides of the electronic component 40.

The pressing member 80 is moved towards the electronic component 40 till the back wall 851 abuts against the electronic component 40. The back wall 851 and the positioning piece abut against two adjacent sidewalls of the electronic component 40. The pressing piece 85 and the card body 42 are located at a same horizontal parallel with the main body 22 and supported together by the supporting member 70.

The securing post 64 of the fastener 60 is inserted into a hole defined by the fastening hole 424 and the securing hole 852 and engaged in the latching hole in order to mount the pressing member 80 on the circuit board 20. The head 62 of the fastener 60 is received in the operation hole 611 and abuts against the pressing piece 85 and the card body 42 simultaneously. The pressing panel 81 presses against the antenna module 90 in the channel 84, thereby mounting the antenna module 90 to the circuit board firmly.

The embodiments shown and described above are only examples. Many details are often found in the art such as the other features of a mounting apparatus, component assembly, and electronic device. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A mounting apparatus configured to mount an antenna module to an electronic component, comprising:
   a pressing member defining a channel and comprising:
      a pressing panel;
      a pressing block extending from the pressing panel; and
      a positioning piece extending from the pressing panel;
   wherein the channel is located between the pressing block and the positioning piece, the pressing member is configured to be mounted on a circuit board with the pressing panel pressing the antenna module in the channel, the pressing block pressing the electronic component, and the positioning piece abutting against a sidewall of the electronic component.

2. The mounting apparatus of claim 1, further comprising a supporting member configured to be mounted in the circuit board, wherein the pressing member and the electronic component are configured to be supported together by the supporting member, and the pressing panel and the supporting member are located at two opposite sides of the electronic component.

3. The mounting apparatus of claim 2, further comprising a fastener, wherein the pressing member further comprises a pressing piece extending from the pressing block, the pressing piece defines a securing hole, and the fastener is engaged with the supporting member through the securing hole.

4. The mounting apparatus of claim 3, wherein the pressing piece has a back wall connected to the pressing block, and the back wall abuts against another sidewall adjacent to the sidewall.

5. The mounting apparatus of claim 4, wherein the pressing block has a bottom surface parallel with the pressing panel, and the back wall is perpendicularly connected to the bottom surface.

6. The mounting apparatus of claim 4, wherein the positioning piece is substantially perpendicular to the pressing panel, and the back wall is substantially perpendicular to the positioning piece.

7. The mounting apparatus of claim 5, wherein the pressing panel defines an operation hole extending to the pressing block, and the operation hole is communicated with the securing hole.

8. The mounting apparatus of claim 7, wherein the fastener comprises a head and a securing post connected to the head, the supporting member defines a latching hole, the securing post is inserted into the securing hole and engaged in the latching hole, the head is received in the operation hole and abut against the pressing piece.

9. The mounting apparatus of claim 8, wherein the pressing piece covers a part of the operation hole and the bottom surface of the pressing block.

10. The mounting apparatus of claim 1, wherein the positioning piece extends from an end of the pressing panel away from the pressing block.

11. The mounting apparatus of claim 1, wherein the pressing member further comprises a supporting piece extends from an end of the pressing piece, and the supporting piece is configured to be supported on the circuit board.

12. A component assembly comprising:
an electronic component;
an antenna module mounted to the electronic component; and
a mounting apparatus comprising:
a pressing member defining a channel and comprising:
a pressing panel;
a pressing block extending from the pressing panel; and
a pressing piece extending from the pressing block;
wherein the pressing piece has a back wall connected to the pressing block, the pressing panel press against the antenna module in the channel, the pressing block press the electronic component, and the back wall abuts against a sidewall of the electronic component.

13. The component assembly of claim 12, wherein mounting apparatus further comprises a supporting member mounted on a circuit board, the pressing member and the electronic component are corporately supported by the supporting member.

14. The component assembly of claim 13, further comprising a fastener, wherein the electronic component defines a fastening hole, the pressing piece defines a securing hole, and the fastener is inserted into a hole defined by the fastening hole and the securing hole and engaged with the supporting member.

15. The component assembly of claim 14, wherein the pressing panel defines an operation hole extending to the pressing block and is communicated with the securing hole, the fastener comprises a head, the head is received in the operation hole and abuts against the pressing piece and the electronic component simultaneously.

16. The component assembly of claim 12, wherein the pressing member further comprises a positioning piece extending from the pressing panel, and the channel is located between the positioning piece and the pressing block.

17. The component assembly of claim 16, wherein the positioning piece and the back wall of the pressing piece abut against two adjacent sidewalls of the electronic component.

18. The component assembly of claim 12, wherein the pressing member further comprises a supporting piece configured to be supported on a circuit board, and the supporting piece extends from the pressing piece.

19. An electronic device comprises:
an enclosure;
a circuit board mounted in the enclosure;
an electronic component attached to the circuit board;
an antenna module mounted to the electronic component; and
a mounting apparatus comprising:
a pressing member mounted to the circuit board, comprising:
a pressing panel;
a pressing block extending from the pressing panel;
a positioning piece extending from the pressing panel; and
a pressing piece extending from the pressing block;
wherein the pressing piece has a back wall, the pressing block presses the electronic component, the pressing panel presses against the antenna module, and the back wall and the positioning piece abut against two adjacent sidewalls of the electronic component.

20. The electronic device of claim 19, further comprising a fastener and a supporting member mounted in the circuit board, wherein the electronic component comprises a card body defining a fastening hole, the pressing piece defines a securing hole, the card body and the pressing panel are supported together by the supporting member, the fastener is inserted into a hole defined by the fastening hole and the securing hole and engaged with the supporting member, and the pressing panel and the card body are located a horizontal plane parallel to the circuit board.

* * * * *